(12) United States Patent
Jang et al.

(10) Patent No.: US 11,145,696 B2
(45) Date of Patent: Oct. 12, 2021

(54) DISPLAY USING PASSIVE MATRIX ORGANIC LIGHT EMITTING DIODE

(71) Applicant: Solomon Systech (Shenzhen) Ltd, Shenzhen (CN)

(72) Inventors: Hong Jae Jang, Seoul (KR); Hyung-Cheol Shin, Daejeon (KR); Il-Hyun Yun, Daejeon (KR); Wai Hon Ng, Hong Kong (HK); Pui Yuen Lam, Hong Kong (HK)

(73) Assignee: Solomon Systech (Shenzhen) Ltd., Shenzhen (CN)

( * ) Notice: Subject to any disclaimer, the term of this patent is extended or adjusted under 35 U.S.C. 154(b) by 0 days.

(21) Appl. No.: 16/662,065

(22) Filed: Oct. 24, 2019

(65) Prior Publication Data

US 2020/0161381 A1 May 21, 2020

(30) Foreign Application Priority Data

Oct. 25, 2018 (KR) .................. 10-2018-0128437

(51) Int. Cl.
*H01L 27/32* (2006.01)
*G09G 3/3216* (2016.01)
*H01L 51/52* (2006.01)

(52) U.S. Cl.
CPC ......... *H01L 27/323* (2013.01); *G09G 3/3216* (2013.01); *H01L 51/5215* (2013.01); *H01L 51/5234* (2013.01); *G09G 2310/0297* (2013.01)

(58) Field of Classification Search
CPC ............... H01L 27/323; H01L 27/3288; H01L 27/3281; G09G 3/3216
See application file for complete search history.

(56) References Cited

U.S. PATENT DOCUMENTS

| 10,725,591 B1* | 7/2020 | Maharyta ................ G06F 3/044 |
| 2011/0080370 A1* | 4/2011 | Wu ...................... G06F 3/04166 |
| | | 345/174 |

(Continued)

FOREIGN PATENT DOCUMENTS

KR    10-2014-0126823 A    11/2014

OTHER PUBLICATIONS

Office Action issued in corresponding Korean patent application No. 10-2018-0128437 dated Feb. 20, 2020.

*Primary Examiner* — Michele Fan
(74) *Attorney, Agent, or Firm* — Idea Intellectual Limited; Margaret A. Burke; Sam T. Yip

(57) ABSTRACT

A passive matrix organic light emitting diode (PMOLED) display which includes a plurality of lower electrode patterns arranged in parallel, a plurality of transparent electrode patterns arranged in parallel in a direction and being perpendicular to the lower electrode pattern, and an organic compound layer interposed between the lower electrode pattern and the transparent electrode pattern and by time-sharing control period into a display control period and a touch sensor control period for each display frame to implement image output and touch sensing; the display includes: a plurality of mutual electrode patterns provided to the vicinity of a display area defined by the lower electrode pattern and the transparent electrode pattern; a display driving circuit; a multiplexer; and a touch driving circuit connected to the lower electrode pattern or the transparent electrode pattern through the multiplexer in the touch sensor control period.

5 Claims, 12 Drawing Sheets

(56) References Cited

U.S. PATENT DOCUMENTS

| | | | | |
|---|---|---|---|---|
| 2012/0092350 | A1* | 4/2012 | Ganapathi | G06F 3/0446 |
| | | | | 345/501 |
| 2016/0365367 | A1* | 12/2016 | Kimura | G06F 3/0446 |
| 2017/0192591 | A1* | 7/2017 | Jang | G06F 3/0383 |
| 2017/0364184 | A1* | 12/2017 | Weinerth | G06F 3/0442 |
| 2019/0004649 | A1* | 1/2019 | Ju | G06F 3/03545 |
| 2019/0138150 | A1* | 5/2019 | Kim | G06F 3/0443 |
| 2019/0196644 | A1* | 6/2019 | Chung | G06F 3/04162 |

* cited by examiner

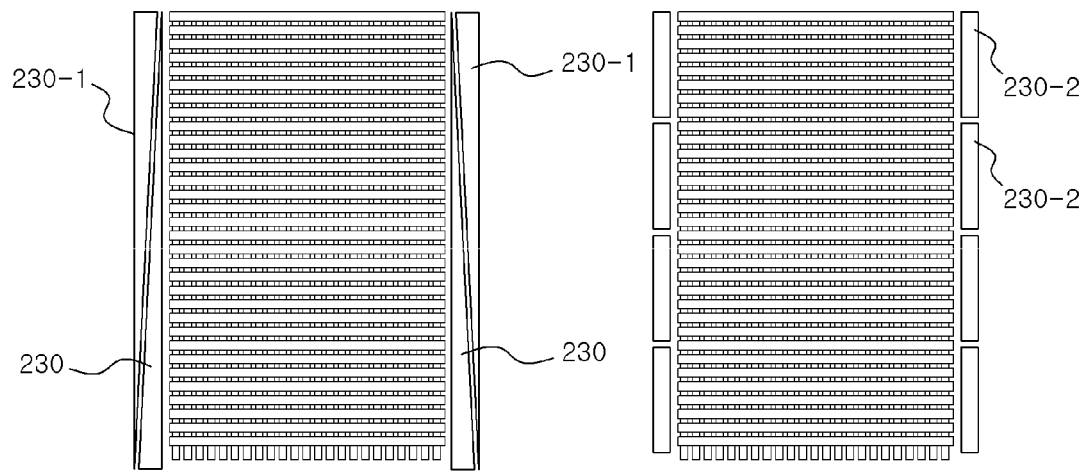
FIG. 5A  FIG. 5B
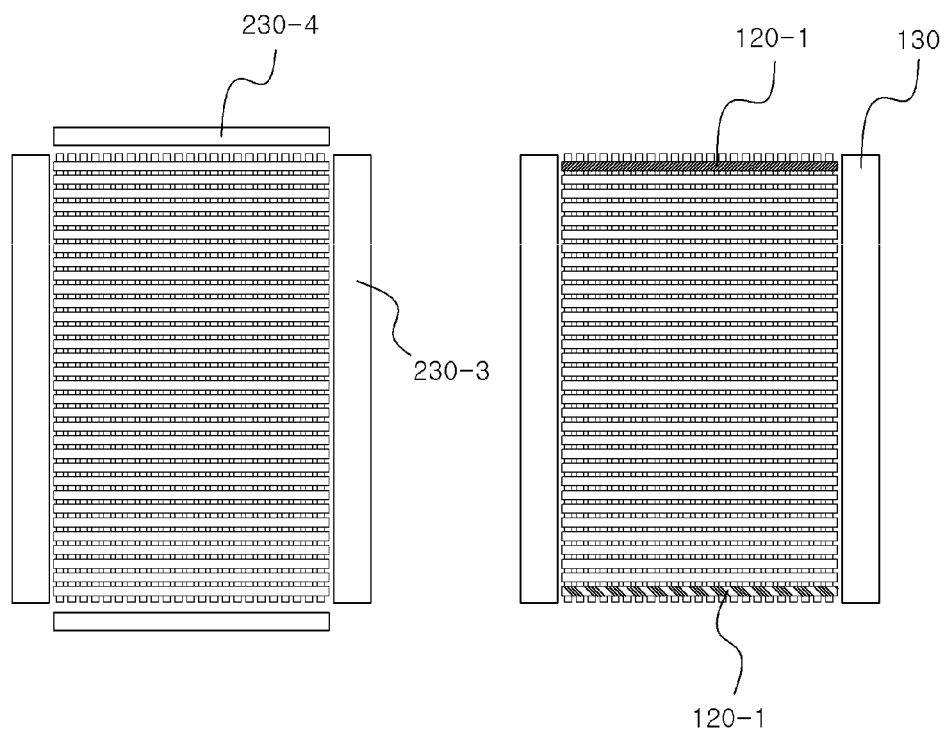
FIG. 5C  FIG. 5D

DISPLAY USING PASSIVE MATRIX ORGANIC LIGHT EMITTING DIODE

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS-REFERENCE TO RELATED APPLICATION

This application claims priority to Korean Patent Application No. 10-2018-0128437, filed on Oct. 25, 2018, the disclosure of which is incorporated by reference herein in its entirety.

FIELD OF THE INVENTION

The present invention relates to a display using a passive matrix organic light emitting diode (PMOLED) among organic light emitting diodes, and more particularly, to a PMOLED display capable of implementing a touch in an in-cell structure in a PMOLED.

BACKGROUND OF THE INVENTION

An organic light emitting diode emits light directly from a light emitting layer positioned between a cathode and an anode and thus there are advantages in that a backlight is not required and an expression range of light is wider than that of an LCD (Liquid Crystal Display) and a black level is excellent. In other words, when the voltage is applied to the cathode and the anode in the organic light emitting diode, electrons and holes are injected into each electrode, and the injected electrons and holes pass through an electron transport layer and a hole transport layer to be coupled with each other in the light emitting layer.

A light emitting material of the light emitting layer is to be excited by coupling energy, and light is generated when returning to a ground state from the excited state. The light that returns from the excited state (singlet state) to the ground state is used as fluorescent light, and the light that returns from the singlet state to the ground state through a triplet state where an energy level is rather low in the singlet state is used as phosphorescent light. Even in an excited state, energy that is not well utilized by light may be inactivated without being radiated.

In the organic light emitting diode, a metal thin film of aluminum, silver, magnesium alloy, calcium, etc. is used for the cathode, and a transparent metal thin film of indium tin oxide (ITO) may be used for the anode. An organic compound layer formed between the cathode and the anode may include a hole injection layer (HIL), a hole transport layer (HTL), an emission layer (EML), an electron transport layer (ETL), and an electron injection layer (EIL). When a driving voltage is applied between the cathode and the anode, holes passing through the hole transport layer (HTL) and electrons passing through the electron transport layer (ETL) move to the emission layer (EML) to form excitons, and as a result, the emission layer (EML) generates visible light. The generated light is reflected on a reflective surface and passes through a transparent electrode and a substrate (such as a glass plate and a plastic plate).

The organic light emitting diode may be classified into a passive matrix organic light emitting diode (PMOLED) and an active matrix organic light emitting diode (AMOLED) according to the control method.

The PMOLED is a method to illuminate an intersection point by applying voltage on a horizontal axis and a vertical axis of the light emitting elements which arranged on the screen, and the structure is relatively simple and the production cost is low, but there is a disadvantage that it cannot implement a sophisticated screen. The AMOLED is to overcome the shortcomings of PMOLED, and has an advantage of controlling individually whether each element emits light by embedding a thin film transistor (TFT) for each light emitting element and recently, a screen size has extended its application range to be applied to large devices.

Korean Patent Registration No. 10-1170806 discloses an element for a passive matrix, but specifically, does not discloses contents regarding a method for implementing a touch function in a PMOLED.

SUMMARY OF THE INVENTION

An object of the present invention is to provide a PMOLED display that can implement a touch function in an in-cell type in a PMOLED and sense a touch area using a change in mutual capacitance.

Another object of the present invention is to provide a PMOLED display having an improved structure to implement a touch function in a PMOLED.

According to an embodiment of the present invention in order to achieve the objects of the present invention, a passive matrix organic light emitting diode display which includes a plurality of lower electrode patterns arranged in parallel, a plurality of transparent electrode patterns arranged in parallel in a direction and being perpendicular to the lower electrode pattern, and an organic compound layer interposed between the lower electrode pattern and the transparent electrode pattern and by time-sharing control period of the transparent electrode pattern and the lower electrode pattern into a display control period and a touch sensor control period for each display frame to implement image output and touch sensing; the PMOLED display may include: a plurality of mutual electrode patterns provided to the vicinity of a display area defined by the lower electrode pattern and the transparent electrode pattern; a display driving circuit controlling the lower electrode pattern and the transparent electrode pattern for the image output; a multiplexer interposed on a line connecting at least one of the lower electrode pattern and the transparent electrode pattern and the display driving circuit for the touch sensing; and a touch driving circuit connected to the lower electrode pattern or the transparent electrode pattern through the multiplexer in the touch sensor control period.

The PMOLED display of the embodiment may repeatedly implement a display control period for image output and a touch sensor control period for touch sensing by time-sharing the display frame, a display driving circuit may output an image by using a lower electrode pattern or a transparent electrode pattern in the display control period, and sense a location of a body touch through a change in mutual capacitance by using at least one mutual electrode pattern of the lower electrode pattern and the transparent electrode pattern in the touch sensor control period.

In this specification, the mutual electrode pattern may perform the touch sensing through interaction with the transparent electrode pattern, or perform the touch sensing through the interaction with the lower electrode pattern or perform the touch sensing even through the interaction with both the transparent electrode pattern and the lower electrode pattern.

Further, in the case of an electrode pattern selected among the lower electrode pattern and the transparent electrode pattern, all electrode patterns may be shorted and operated as one electrode, or alternatively, adjacent electrode patterns may operate by forming a plurality of groups and respective electrode patterns may be individually used for sensing the location of the body touch through the interaction with the mutual electrode pattern without grouping.

In the embodiment, the mutual electrode patterns may be provided to be symmetrical to each other at the left and right sides or upper and lower sides of the display area. When two mutual electrode patterns are provided at the left and right sides of the display area, one-dimensional body touch locations for the left and right sides may be sensed and when two mutual electrode patterns are provided at the upper and lower sides of the display area, one-dimensional body touch locations for the upper and lower sides may be sensed. Further, when four mutual electrode patterns are provided at the upper and lower sides and the left and right sides of the display area, two-dimensional body touch locations for the upper and lower sides and the left and right sides may be sensed.

The mutual electrode pattern may be provided in a long rectangular shape or a long triangular shape in the vicinity of the display area. When the mutual electrode pattern is provided in the long triangular shape, the location in a longitudinal direction of the mutual electrode pattern may be sensed. Further, when the mutual electrode pattern is provided in the long triangular shape, two mutual electrode patterns are provided to face each other, the location in the longitudinal direction may be sensed and the mutual electrode pattern may be provided in the same width at the left and right sides.

One mutual electrode pattern may be provided on one side of the display area, or alternatively, the mutual electrode pattern may be divided and provided into a plurality of mutual electrode patterns along one side. When the mutual electrode pattern is divided into the plurality of mutual electrode patterns, the mutual electrode pattern serves as the transmitter or receiver electrode to be used for sensing the location depending on the arrangement direction of the plurality of mutual electrode patterns.

The mutual electrode patterns may be provided symmetrically to each other at the left and right sides or the upper and lower sides of the display area and the electrode patterns disposed at the upper and lower ends or left and right ends of the lower electrode pattern or the transparent electrode pattern may be used as the mutual electrode patterns. That is, when only a pair of mutual electrode patterns are used, only one-dimensional location sensing is possible and even if the mutual electrode patterns are not arranged, two-dimensional location sensing is possible even by using the lower electrode patterns or transparent electrode patterns positioned at both ends.

The mutual electrode pattern may be formed on the same layer as the lower electrode pattern or the transparent electrode pattern, or alternatively, the mutual electrode pattern may be formed on the transparent cover covering the display area and formed on the printed circuit board disposed below the display. That is, the mutual electrode pattern may be provided on the same layer as the lower electrode pattern or the transparent electrode pattern, but need not particularly be provided on the same layer as the lower electrode pattern or the transparent electrode pattern and the mutual electrode pattern may be even provided with vertical gap if the mutual electrode pattern can influence the change in mutual capacitance.

Further, the mutual electrode pattern may be made of a material which is the same as the transparent electrode pattern, such as ITO, or it may be provided by patterning and etching the same thin film as the lower electrode pattern and the transparent electrode pattern; alternatively, the mutual electrode pattern may be separately manufactured at a separate location.

The respective transparent electrode patterns individually operate to correspond to the mutual electrode patterns, or the touch driving circuit for the touch sensing may group a plurality of adjacent transparent electrode patterns only in the touch sensor control period and the grouped transparent electrode patterns are used as one electrode to measure the change in mutual capacitance with the mutual electrode pattern.

Of course, the entire transparent electrode pattern may serve as one group to measure the mutual capacitance, or only some of the transparent electrode patterns may be selected and defined as one group and the mutual capacitance may be measured by using the same transparent electrode patterns.

According to the present invention, the mutual electrode pattern may serve as the transmitter electrode transmitting the touch driving signal and the lower electrode pattern or the transparent electrode pattern may serve as the receiver electrode sensing the touch driven signal corresponding to the touch driving signal, or conversely, the lower electrode pattern or the transparent electrode pattern may operate as the transmitter electrode and the mutual electrode pattern may operate as the receiver electrode. Here, in the touch sensor control period, the lower electrode pattern or the transparent electrode pattern connected to the touch driving circuit may be used and according to a design, all or some of the lower electrode patterns and the transparent electrode patterns may be used for the touch sensor control period.

In the case of the PMOLED, touch sensing may not be smooth due to capacitance remaining between the transparent electrode pattern and the lower electrode pattern. Therefore, in the embodiment, in a step of performing the touch sensing, an electrode which is not used as the receiver electrode may be floated.

In the embodiment, image reference voltage may be uniformly supplied to all lower electrode patterns before the display control period. The reason is that reference voltage value for the touch sensing and reference voltage value for the image output may be different from each other. Here, the image reference voltage may be set within a range of approximately 5 V to 20 V.

According to an embodiment of the present invention in order to achieve the objects of the present invention, a passive matrix organic light emitting diode display which includes a plurality of lower electrode patterns arranged in parallel, a plurality of transparent electrode patterns arranged in parallel in a direction and being perpendicular to the lower electrode pattern, and an organic compound layer interposed between the lower electrode pattern and the transparent electrode pattern and by time-sharing control period of the transparent electrode pattern and the lower electrode pattern into a display control period and a touch sensor control period for each display frame to implement image output and touch sensing; the PMOLED display may include: a plurality of mutual electrode patterns provided to the vicinity of a display area defined by the lower electrode pattern and the transparent electrode pattern; a first touch driving circuit connected to the mutual electrode pattern and providing a touch driving signal in the touch sensor control period; a multiplexer connected to at least one of the lower electrode pattern and the transparent electrode pattern; a display driving circuit connected to the multiplexer and providing a display driving signal for controlling the image output in the display control period; and a second touch driving circuit connected to the multiplexer and receiving a touch driven signal corresponding to the touch driving signal in the touch sensor control period.

The mutual electrode patterns may be provided to be symmetrical to each other at the left and right sides or the upper and lower sides of the display area as a transmitter electrode and the mutual electrode pattern may be divided and provided into a plurality of mutual electrode patterns along one side of the display area. When the mutual electrode pattern is divided and provided, the first touch driving circuit may sequentially provide the touch driving signal to respective mutual electrode patterns in the touch sensor control period and the multiplexer may transfer a touch driven signal generated in the lower electrode pattern or the transparent electrode pattern corresponding to the touch driving signal to the second touch driving circuit.

The lower electrode patterns or the transparent electrode patterns generating the touch driven signal may be grouped into one to serve as one electrode, or alternatively, may be grouped into electrodes of a number which is relatively smaller than the total number of electrode patterns. When the lower electrode patterns or transparent electrode patterns are grouped into a plurality of groups, the touch driven signal may include positional information for left and right sides or upper and lower sides of the mutual electrode patterns facing each other and may also include information on a location depending on an arrangement direction (a direction and being perpendicular to the left and right sides or the upper and lower sides) of the lower electrode pattern or the transparent electrode pattern.

According to an embodiment of the present invention in order to achieve the objects of the present invention, a passive matrix organic light emitting diode display which includes a plurality of lower electrode patterns arranged in parallel, a plurality of transparent electrode patterns arranged in parallel in a direction and being perpendicular to the lower electrode pattern, and an organic compound layer interposed between the lower electrode pattern and the transparent electrode pattern and by time-sharing control period of the transparent electrode pattern and the lower electrode pattern into a display control period and a touch sensor control period for each display frame to implement image output and touch sensing; the PMOLED display may include: a multiplexer connected to at least one of the lower electrode pattern and the transparent electrode pattern; a display driving circuit connected to the multiplexer and providing a display driving signal for controlling the image output in the display control period; a first touch driving circuit connected to the multiplexer and providing a touch driving signal in the touch sensor control period; a plurality of mutual electrode patterns provided to the vicinity of a display area defined by the lower electrode pattern and the transparent electrode pattern; and a second touch driving circuit connected to the mutual electrode pattern and receiving a touch driven signal by the touch driving signal in the touch sensor control period.

The mutual electrode patterns may be provided to be symmetrical to each other at the left and right sides or the upper and lower sides of the display area and the mutual electrode pattern may be divided and provided into a plurality of mutual electrode patterns along one side of the display area. When the mutual electrode pattern is divided and provided, the multiplexer may transfer the touch driving signal provided from the first touch driving circuit to the lower electrode pattern or the transparent electrode pattern in the touch sensor control period and the second touch driving circuit may receive the touch driven signal generated in the mutual electrode pattern corresponding to the touch driving signal in the touch sensor control period.

Here, the selected lower electrode pattern or the transparent electrode pattern may receive the touch driving signal and transmit the received touch driving signal to the mutual electrode pattern and in this case, the selected lower electrode pattern or the transparent electrode pattern are grouped into one to serve as one electrode.

Besides, the lower electrode pattern or the transparent electrode pattern transmitting the touch driving signal may be grouped into a plurality of electrode patterns and the grouped lower electrode pattern or transparent electrode pattern may serve as one electrode. In the touch sensor control period, the touch driving signal may be sequentially provided to the lower electrode pattern or the transparent electrode pattern of each group and the touch driving signal generated from the mutual electrode pattern may be sensed in the mutual electrode pattern and the touch driven signal may include information on a location depending on an arrangement direction of the lower electrode pattern or the transparent electrode pattern.

According to the PMOLED display and the control method thereof, the touch function can be implemented in the in-cell type in the PMOLED, and the touch function using the change of mutual capacitance in the PMOLED can be simply implemented.

In addition, in implementing the touch function in the PMOLED, by using the collective reset of the driving voltage, the influence of the residual capacitance or the like can be effectively eliminated.

In general, it is difficult to implement the touch function in a PMOLED display because it is not easy to implement the touch function under an execution condition for the image output of the PMOLED. However, with the PMOLED display and the control method thereof provided by the present invention, a condition for mutual type touch sensing can also be satisfied while satisfying the condition for the image output of the PMOLED.

BRIEF DESCRIPTION OF THE DRAWINGS

FIG. 5A-5D is a structural diagram for describing a circuit structure of a PMOLED display according to another embodiment of the present invention.

DETAILED DESCRIPTION

Figure 1:
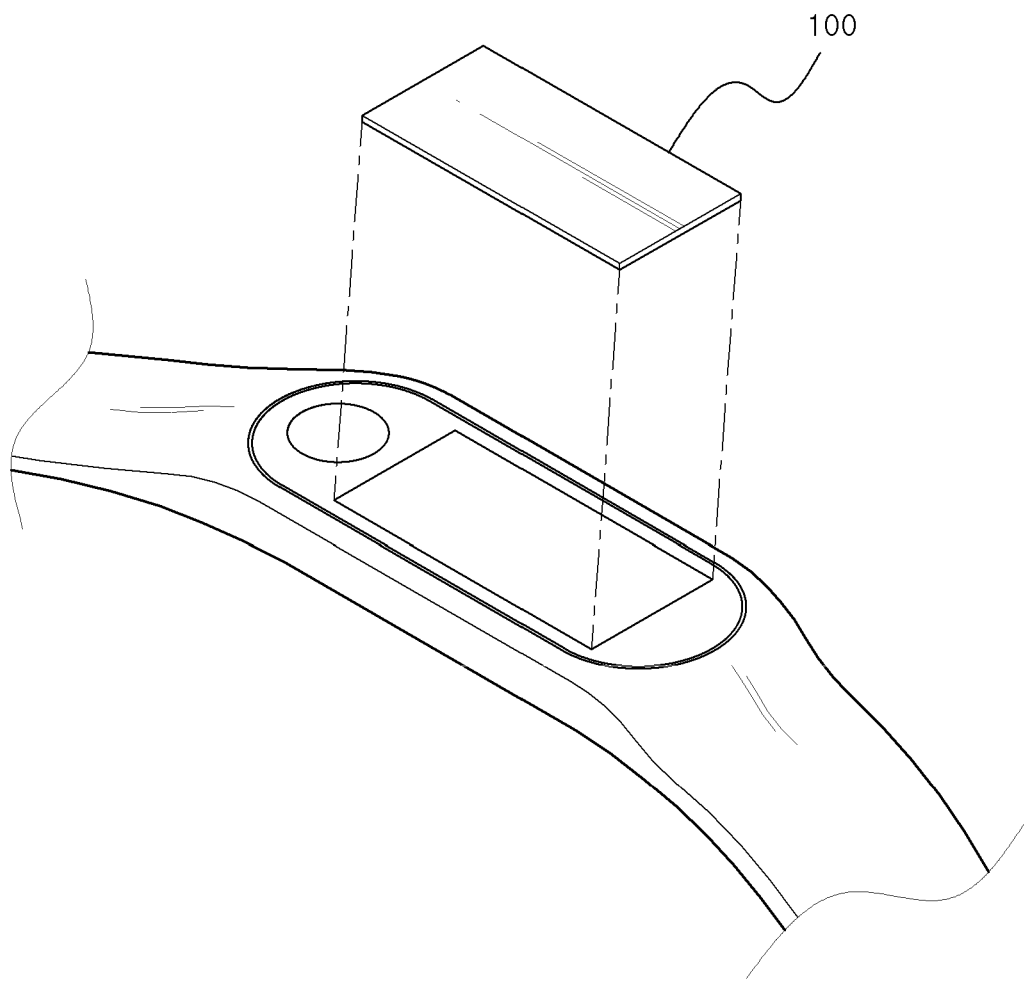
FIG. 1 is a perspective view illustrating a use example of a passive matrix organic light emitting diode display according to an embodiment of the present invention.

Hereinafter, embodiments of the present invention will be described in detail with reference to the accompanying drawings, but the present invention is not limited or restricted to the embodiments. For reference, in the description, like reference numerals substantially refer to like elements, which may be described by citing contents disclosed in other drawings under such a rule and contents determined to be apparent to those skilled in the art or repeated may be omitted.

Figure 2:
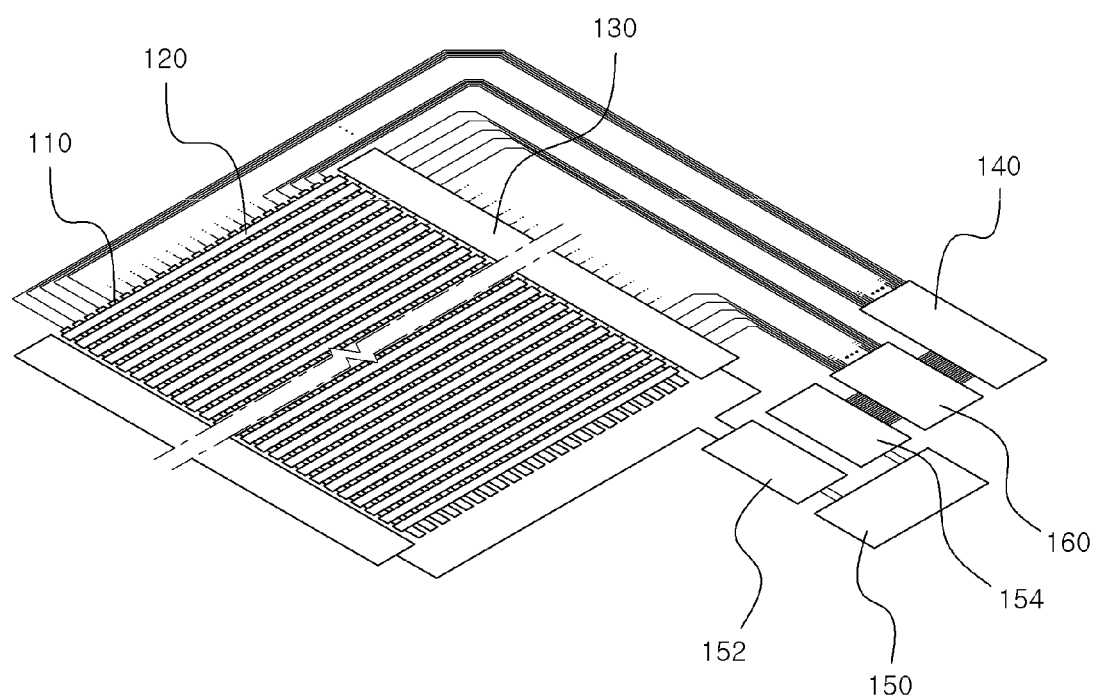
FIG. 2 is a perspective view for describing an electrode pattern structure of a PMOLED display according to an embodiment of the present invention.
Figure 3:
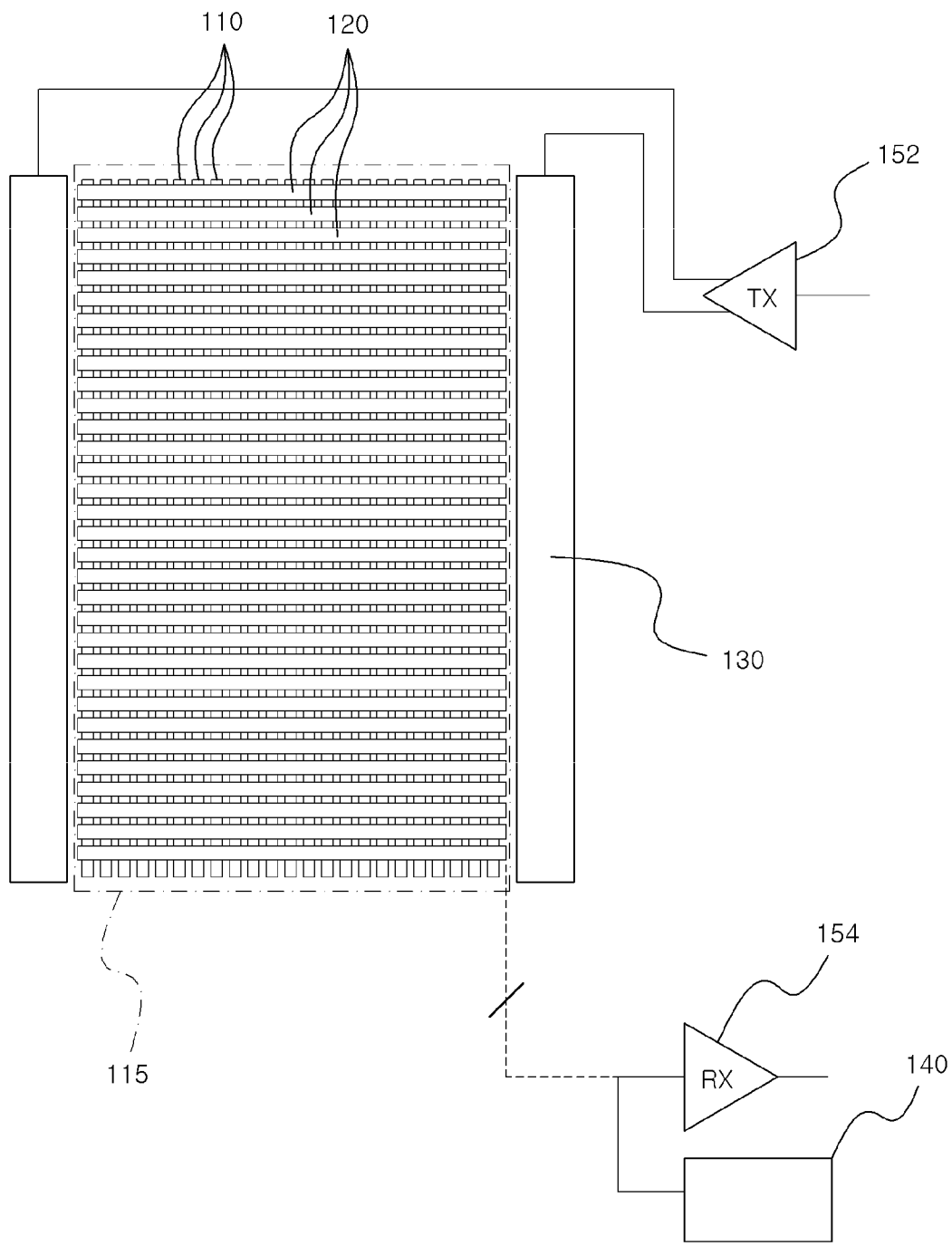
FIG. 3 is a structural diagram for describing a circuit structure of the PMOLED display of FIG. 2.

FIG. 1 is a perspective view illustrating a use example of a passive matrix organic light emitting diode display according to an embodiment of the present invention, FIG. 2 is a perspective view for describing an electrode pattern structure of a PMOLED display according to an embodiment of the present invention, and FIG. 3 is a structural diagram for describing a circuit structure of the PMOLED display of FIG. 2.

Referring to FIG. 1, the PMOLED display 100 according to an embodiment of the present invention may be applied to a small device or a wearable device including a PMOLED display. In the embodiment, a case where the PMOLED display 100 is applied to a small wearable band, but in another embodiment, the PMOLED display 100 may be applied to display modules of various devices.

Referring to FIGS. 2 and 3, the PMOLED display 100 includes a plurality of lower electrode patterns 110 arranged in parallel, a plurality of transparent electrode patterns 120 arranged in parallel in a direction and being perpendicular to the lower electrode patterns 110, a pair of mutual electrode patterns 130 provided to left and right sides of the transparent electrode pattern 120 in a display area 115, and an organic compound layer (not illustrated) interposed between the lower electrode pattern 110 and the transparent electrode pattern 120. The transparent electrode pattern 120 and the lower electrode pattern 110 may be connected to a display driving circuit 140 and desired images or characters may be displayed through the PMOLED display 100 for each pixel through the control of the display driving circuit 140.

Figure 4:
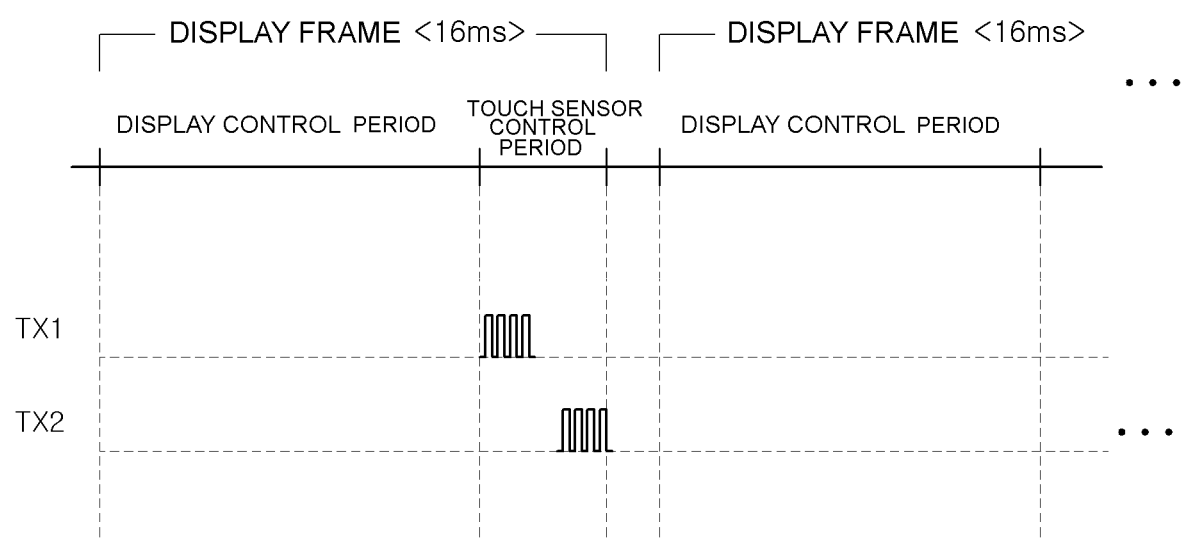
FIG. 4 is a diagram for describing a process of providing a touch driving signal to a mutual electrode pattern in a time-sharing state for each display frame in a PMOLED display according to an embodiment of the present invention.

As illustrated in FIG. 4 to be described below, the PMOLED display 100 according to the embodiment may implement image output and touch sensing in different time zones by time-sharing the control period of the transparent electrode pattern 120 and the lower electrode pattern 110 into a display control period and a touch sensor control period for each display frame and allow the image output and the touch sensing to be alternately performed.

According to the embodiment, the PMOLED display 100 may further include a touch sensing unit 150 in addition to the display driving circuit 140 and the touch sensing unit 150 may include a first touch driving circuit 152 generating a touch driving signal and a second touch driving circuit 154 receiving a touch driven signal received in response to the touch driving signal. The display driving circuit 140 and the touch sensing unit 150 are functionally separated from each other, but may be formed together in one integrated circuit (IC) and may be functionally and physically separated from each other as in the embodiment.

However, a separate touch sensor is not used for the touch sensing and the PMOLED display 100 according to the embodiment may perform the touch sensing by using the transparent electrode pattern 120 positioned on a relatively upper part and mutual electrode patterns 130 disposed around the transparent electrode pattern 120. To this end, the transparent electrode pattern 120 and the display driving circuit 140 may be connected to each other and the touch sensing unit 150 and the transparent electrode pattern 120 may be electrically connected to each other. In the display control period, the touch sensing unit 150 may be turned off and the transparent electrode pattern 120 and the display driving circuit 140 may be functionally connected to each other and in the touch sensor control period, the display driving circuit 140 may be turned off and the touch sensing unit 150 and the transparent electrode pattern 120 may be functionally connected to each other.

Besides, the transparent electrode pattern 120 and the second touch driving circuit 154 may be selectively connected using a multiplexer or the like.

FIG. 4 is a diagram for describing a process of providing a touch driving signal to a mutual electrode pattern in a time-sharing state for each display frame in the PMOLED display of FIG. 3.

Referring to FIG. 4, all of the transparent electrode patterns 120 may be shorted to serve as one electrode in a touch sensing step and the first touch driving circuit 152 may sequentially provide touch driving signals TX1 and TX2 to the mutual electrode patterns 130.

The first touch driving circuit 152 may provide the first touch driving signal TX1 to one mutual electrode pattern and then provide the second touch driving signal TX2 to the other mutual electrode pattern. The first touch driven signal may be received in the transparent electrode pattern 120 in response to the first touch driving signal TX1, which may be transferred to the second touch driving circuit 154. Further, a second touch driven signal may be received in the transparent electrode pattern 120 in response to the second touch driving signal TX2, which may be transferred to the second touch driving circuit 154.

The touch sensing unit 150 may determine which side of the left and right sides in the display area that a human body touches closer through the first and second touch sensing driven signals. Here, the touch driving signal may be a sinusoidal wave, a triangular wave, or the like in addition to a pulse type square wave. In the embodiment, the touch driving signals TX1 and TX2 are divided by time-sharing in the touch sensor control period; alternatively, the touch driving signals may be divided by using code division or frequency division.

In the display control period, voltage of approximately 10 V may be supplied in the lower electrode pattern 110 and in this case, when a pulse type driving voltage signal is directly provided to the transparent electrode pattern 120 and the lower electrode pattern 110, the touch sensing may not be facilitated due to residual voltage. In order to solve such a problem, in the embodiment, a process such as reset or the like may be applied to all lower electrode patterns 110.

After the touch sensor control period, image reference voltage of approximately 5V or more and 20V or less may be uniformly supplied to all of the lower electrode patterns 110 before the display control period. As an example, by supplying an image reference voltage of approximately 10 V to all of the lower electrode patterns 110, pixels for the display may be reset to maintain an initial state in which an organic light emitting diode does not emit light as a whole.

As illustrated in FIG. 4, the PMOLED display 100 according to the embodiment may time-share the display frame to repeatedly implement the display control period for the image output and the touch sensor control period for the touch sensing. In the display control period, the display driving circuit 140 may output an image using the lower electrode pattern 110 and the transparent electrode pattern 120. In the touch sensor control period, the touch sensing unit 150 may sense the location of the body touch through a change of mutual capacitance by using at least one of the lower electrode pattern 110 and the transparent electrode pattern 120 and the mutual electrode patterns 130.

In the embodiment, the mutual electrode pattern 130 may perform the touch sensing through interaction with the transparent electrode pattern 120. In another embodiment, the lower electrode pattern interacts with the mutual electrode pattern to perform the touch sensing instead of the transparent electrode pattern. Both the transparent electrode pattern and the lower electrode pattern may perform the touch sensing even through the interaction with the mutual electrode pattern.

In addition, although the mutual electrode pattern 130 of the embodiment is provided symmetrically to the left and right sides of the display area 115 around the transparent electrode pattern 120, according to another embodiment, the mutual electrode pattern 130 is provided symmetrically to the upper and lower sides of the display area and in this case, it may be preferable to use the lower electrode pattern 110 rather than the transparent electrode pattern 120.

In the embodiment, the mutual electrode pattern 130 may be formed on the same layer as the transparent electrode pattern 120, but in some cases, the mutual electrode pattern 130 may be formed on the same layer as the lower electrode pattern 110. When the mutual electrode pattern 130 is formed on the same layer as the transparent electrode pattern 120, the mutual electrode pattern 130 may be formed by etching a transparent conductive film such as ITO and IZO (Indium Zinc Oxide) or a metal thin film. When the mutual electrode pattern 130 is formed on the same layer as the lower electrode pattern 110, the mutual electrode pattern 130 may be formed by etching the same metal thin film as the lower electrode pattern.

Besides, the mutual electrode pattern may be formed at a different layer or stack from that of the lower electrode pattern or the transparent electrode pattern in the vicinity of the display area. For example, the mutual electrode pattern may be formed on a transparent cover covering the display area, and may also be formed on a printed circuit board disposed under the display.

In the embodiment, the entire transparent electrode pattern 120 serves as one group to measure the mutual capacitance, or only some of the transparent electrode patterns 120 may be selected and defined as one group, the mutual capacitance may be measured by using the same transparent electrode patterns 120.

FIGS. 5A-5D are structural diagrams for describing circuit structures of PMOLED displays according to other embodiments of the present invention.

Referring to FIG. 5A, a mutual electrode pattern 230 may be provided in a long triangular shape in the vicinity of the display area and when the mutual electrode pattern 230 is provided in the long triangular shape, the location for a longitudinal direction of the mutual electrode pattern 230 may also be sensed. In addition, in the embodiment, two mutual electrode patterns 230 and 230-1 are provided to one side of the display area to face each other, so that widths of the mutual electrode patterns 230 and 230-1 in a vertical direction may be constantly maintained and the location for the longitudinal direction may be implemented by using the mutual electrode patterns 230 and 230-1. Of course, since the mutual electrode patterns 230 and 230-1 are provided symmetrically horizontally, touch locations of the left and right sides may be sensed as shown in the display of FIG. 3.

Referring to FIG. 5B, the mutual electrode patterns 230-2 may be provided symmetrically horizontally and may be divided into a plurality of mutual electrode patterns in the vertical direction at the left and right sides of the display area. As illustrated, when the mutual electrode pattern is divided into the plurality of mutual electrode patterns, the mutual electrode pattern 230-2 may serve as a transmitter or receiver electrode and may be used for sensing the location depending on an arrangement direction of the plurality of mutual electrode patterns by using time-division, code-division or frequency-division multiplexing, etc. Of course, since the mutual electrode patterns 230-2 are provided symmetrically horizontally, touch locations of the left and right sides may be sensed as shown in the display of FIG. 3.

Referring to FIG. 5C, two pairs of mutual electrode patterns 230-3 and 230-4 may be provided to the left and right sides and upper and lower sides of the display area, respectively. The mutual electrode patterns 230-3 arranged to the left and right sides may be used for sensing left and right locations and the mutual electrode patterns 230-4 arranged to the upper and lower sides may be used for sensing the upper and lower locations.

While the mutual electrode pattern 130 of FIG. 3 is provided only on the left and right sides of the display area to sense a one-dimensional body touch location with respect to a horizontal direction. In the embodiment, when four mutual electrode patterns 230-3 and 230-4 are provided at the upper and lower sides and the left and right sides of the display area, the body touch location may be sensed in two dimensions.

Referring to FIG. 5D, a two-dimensional body touch location may be sensed even by using the transparent electrode pattern 120-1 other than the mutual electrode patterns 130 disposed at the left and right sides. To this end, in the touch sensor control period, one or more electrode patterns 120-1 disposed at upper and lower ends among the transparent electrode patterns may be used as the mutual electrode pattern in response to a direction in which the mutual electrode pattern 130 is not provided, i.e., the vertical direction of the display area. The transparent electrode patterns 120-1 disposed at the upper and lower ends may serve to output the image in the display control period and temporarily serve to perform a similar function to the mutual electrode pattern only in the touch sensor control period. To this end, the first touch driving circuit or the second touch driving circuit may be connected to the electrode patterns 120-1 disposed at the upper and lower ends among the transparent electrode patterns through a multiplexer or the like.

Figure 6:
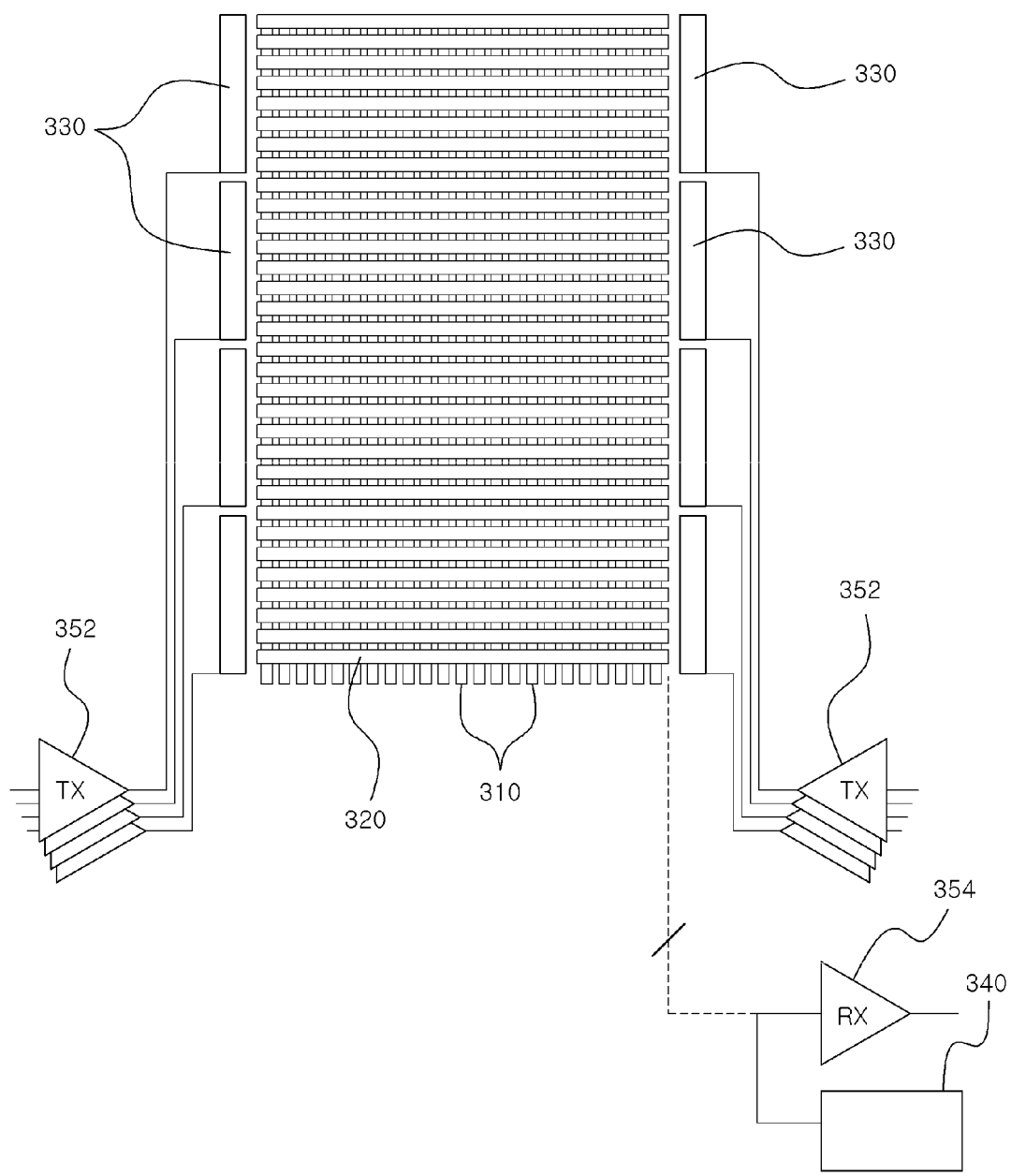
FIG. 6 is a structural diagram for describing a circuit structure of a PMOLED display according to an embodiment of the present invention.
Figure 7:
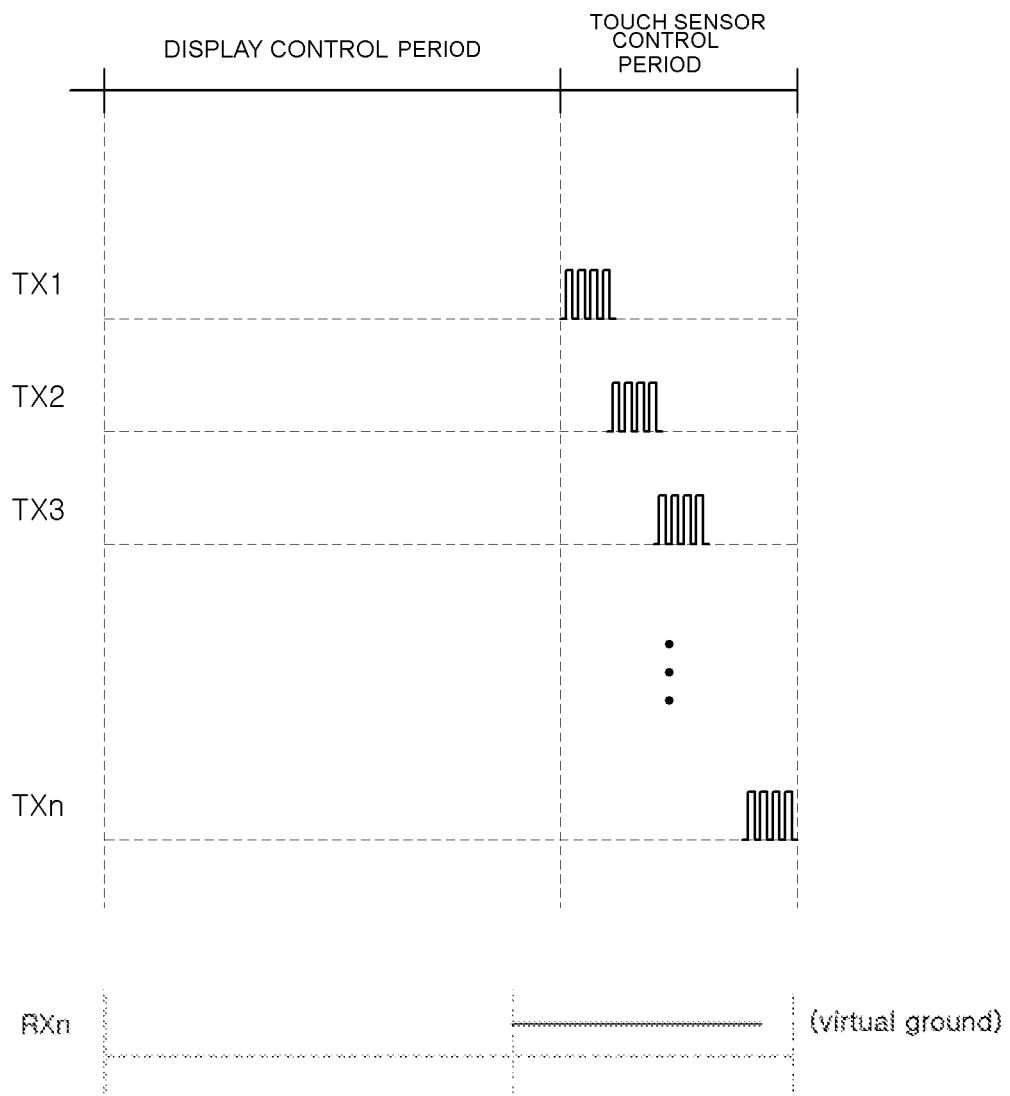
FIG. 7 is a diagram for describing a process of providing a touch driving signal to a mutual electrode pattern in a time-sharing state for each display frame in the PMOLED display of FIG. 6.

FIG. 6 is a structural diagram for describing a circuit structure of a PMOLED display according to an embodiment of the present invention and FIG. 7 is a diagram for describing a process of providing a touch driving signal to a mutual electrode pattern in a time-sharing state for each display frame in the PMOLED display of FIG. 6.

Referring to FIGS. 6 and 7, the PMOLED display includes a lower electrode pattern 310, a transparent electrode pattern 320, an organic compound layer (not illustrated) interposed between the lower electrode pattern 310 and the transparent electrode pattern 320, a plurality of mutual electrode patterns 330 which are symmetrical to each other to the left and right sides of the display area and are divided in the vertical direction, a plurality of first touch driving circuits 352 connected to respective mutual electrode patterns 330, a display driving circuit 340 controlling the image output, and a second touch driving circuit 354.

The PMOLED display of the embodiment is time-sharing into the display control period and the touch sensor control period for each display frame to implement the image output and the touch sensing and control the transparent electrode pattern 320, the lower electrode pattern 310, and the mutual electrode pattern 330 in the display control period and the touch sensor control period.

Specifically, the first touch driving circuit 352 may sequentially provide touch driving signals TX1, TX2, TX3, . . . and TXn to the mutual electrode patterns 330 respectively connected in the touch sensor control period and the transparent electrode pattern 320 may receive a touch driven signal RXn and transfer the received touch driven signal to the second touch driving circuit 354.

For reference, in the embodiment, the touch driving signal is provided in a time division scheme, but in some cases, may be provided in a scheme such as code division or frequency division. Further, the transparent electrode pattern 320 is used as a segment electrode and a receiver electrode, or the lower electrode pattern may be used as a common electrode and the receiver electrode.

In the embodiment, the transparent electrode pattern 320 is shorted through a controller device IC to serve as one electrode, it may not the entirety but only a part may be used as the receiver electrode.

Figure 8:
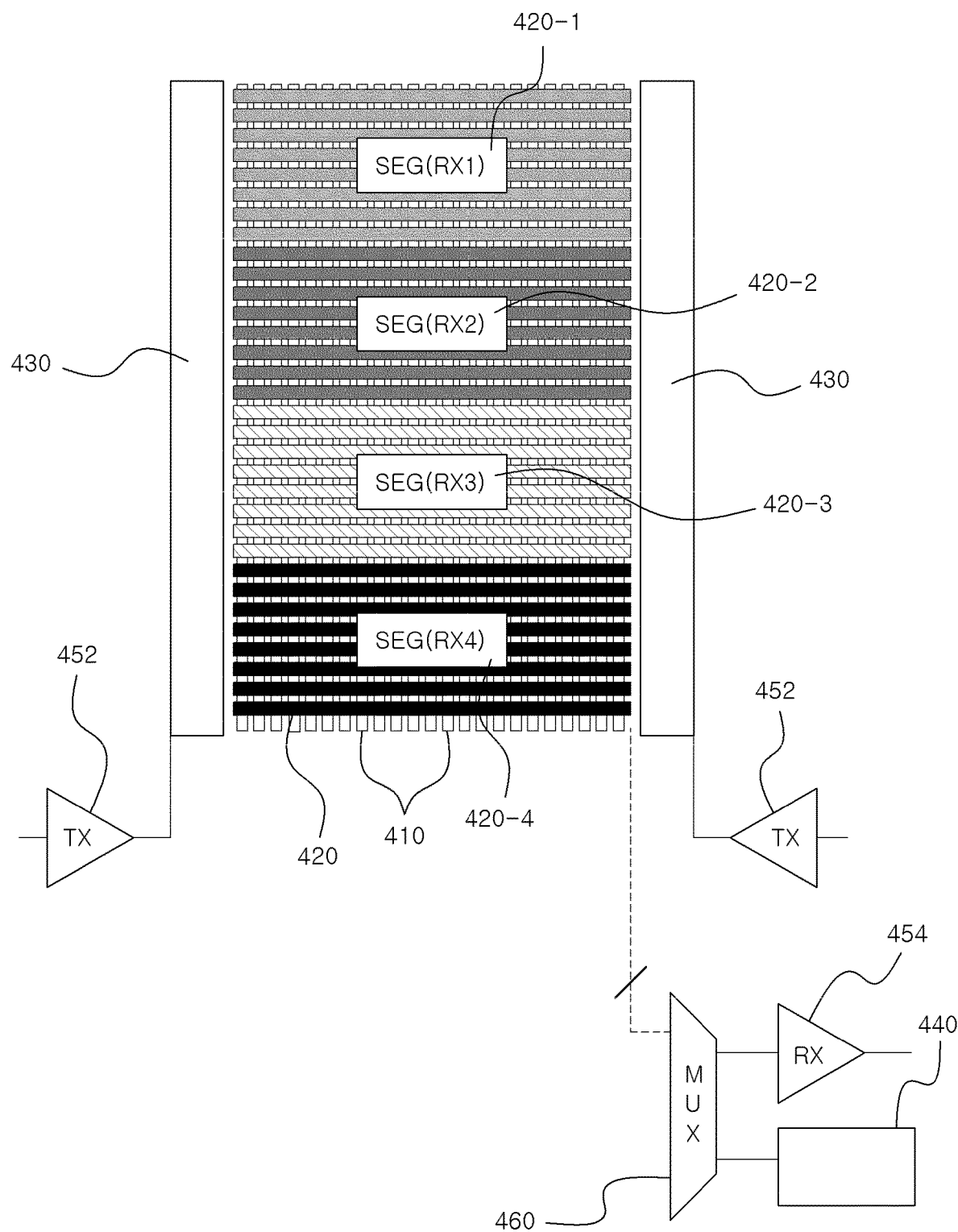
FIG. 8 is a structural diagram for describing a circuit structure of a PMOLED display according to an embodiment of the present invention.

FIG. 8 is a structural diagram for describing a circuit structure of a PMOLED display according to an embodiment of the present invention.

Referring to FIG. 8, the PMOLED display according to the present embodiment may include a lower electrode pattern 410, a transparent electrode pattern 420, an organic compound layer (not illustrated) interposed between the lower electrode pattern 410 and the transparent electrode pattern 420, mutual electrode patterns 430 symmetrical to the left and right sides of the display area, a first touch driving circuit 452 connected to each mutual electrode pattern 430, a multiplexer 460 connected to the transparent electrode pattern 420, a display driving circuit 440 connected to the multiplexer 460 and controlling the image output, and a second touch driving circuit 454 connected to the multiplexer 460 and performing the touch sensing.

The PMOLED display of the embodiment is time-shared into the display control period and the touch sensor control period for each display frame to implement the image output and the touch sensing and may control the transparent electrode pattern 420, the lower electrode pattern 410, and the mutual electrode pattern 430 in the display control period and the touch sensor control period.

For reference, in the touch sensor control period, the multiplexer 460 may group the transparent electrode patterns into four groups 420-1 to 420-4 and each of transparent electrode patterns which are grouped in terms of a circuit may serve as one electrode.

Specifically, the first touch driving circuit 452 may sequentially provide the touch driving signals TX1 and TX2 to the mutual electrode patterns 430 respectively connected in the touch sensor control period and each of four groups of transparent electrode patterns 420-1 to 420-4 may receive the touch driven signal and transfer the received touch driven signal to the second touch driving circuit 454 through the multiplexer 460.

For reference, in the embodiment, the touch driving signal is provided in a time division scheme, but in some cases, may be provided in a scheme such as code division or frequency division. Further, four groups of transparent electrode patterns 420-1 to 420-4 are used as the receiver electrodes, but in another embodiment, the lower electrode patterns are grouped to be used as the receiver electrodes.

The touch driven signals received at four groups of transparent electrode patterns 420-1 to 420-4 may include positional information the display area in the vertical direction and since the mutual electrode pattern 430 are provided to be symmetrical to each other horizontally, the touch locations for the left and right sides may be sensed from the touch driven signal.

Figure 9:
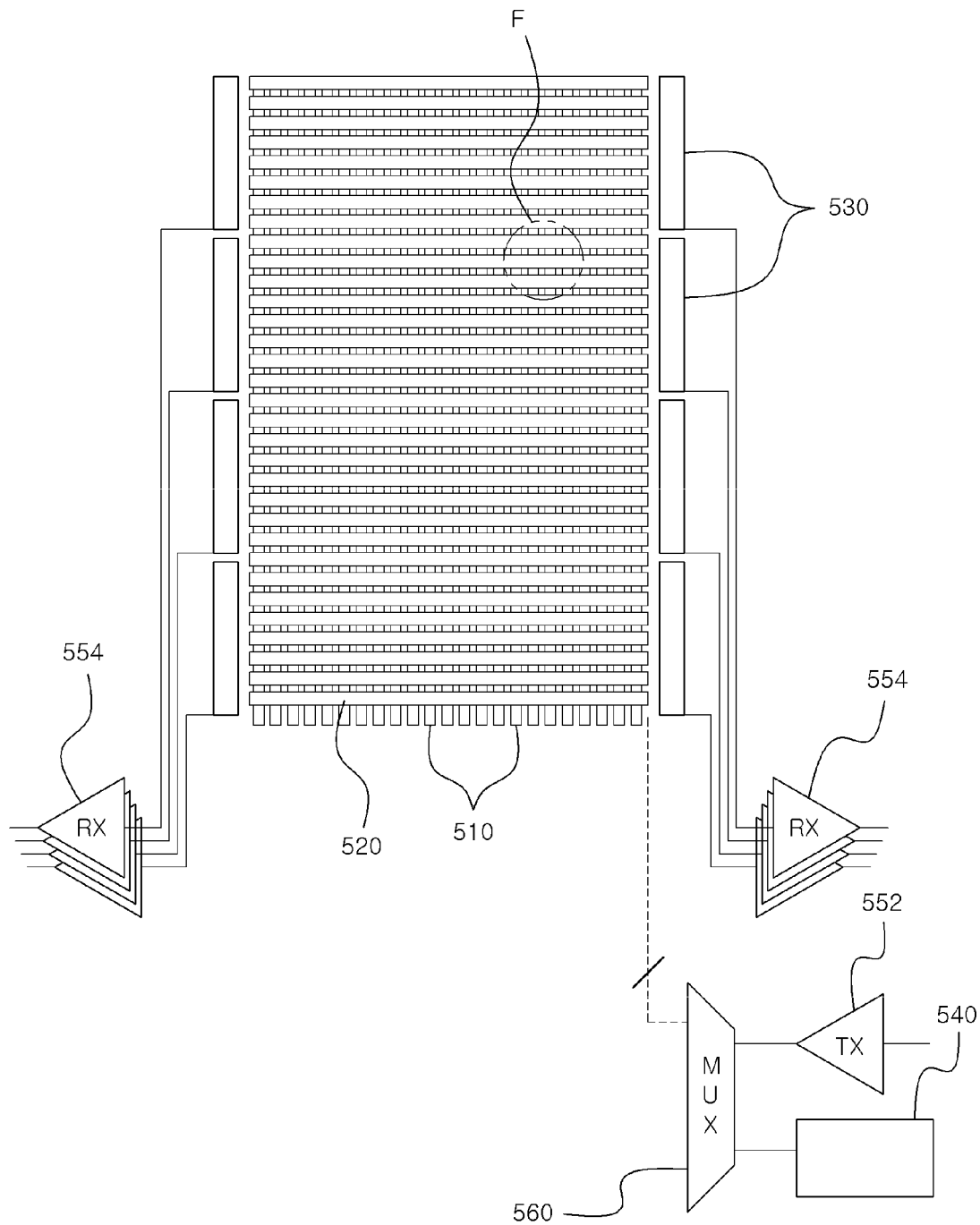
FIG. 9 is a structural diagram for describing a circuit structure of a PMOLED display according to an embodiment of the present invention.
Figure 10:
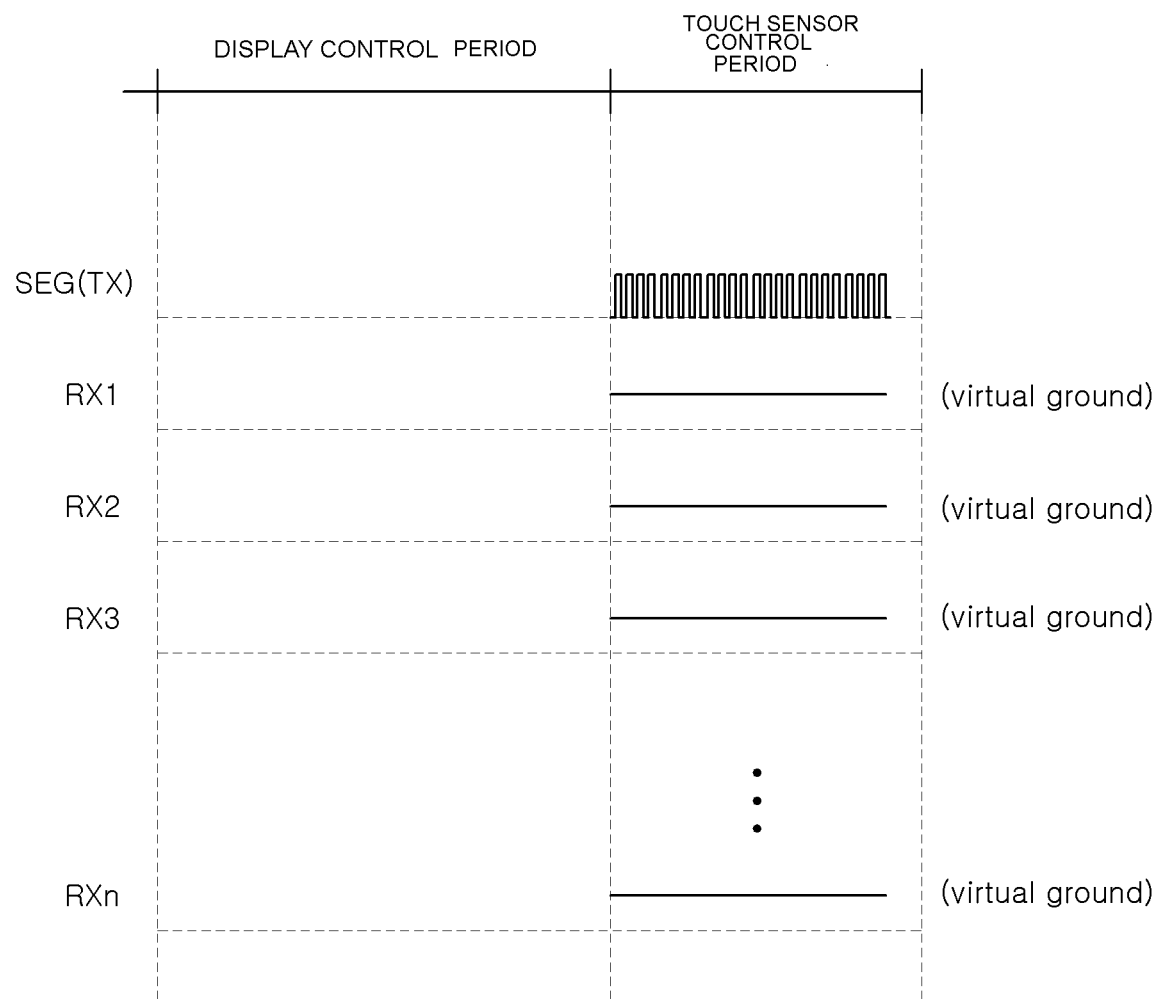
FIG. 10 is a diagram for describing a process of providing a touch driving signals to PMOLED display and a mutual electrode pattern in a time-sharing state for each display frame in the PMOLED display of FIG. 9.

FIG. 9 is a structural diagram for describing a circuit structure of a PMOLED display according to an embodiment of the present invention and FIG. 10 is a diagram for describing a process of providing a touch driving signal to a mutual electrode pattern in a time-sharing state for each display frame in the PMOLED display of FIG. 9.

Referring to FIGS. 9 and 10, the PMOLED display includes a lower electrode pattern 510, a transparent electrode pattern 520, an organic compound layer (not illustrated) interposed between the lower electrode pattern 510 and the transparent electrode pattern 520, a plurality of mutual electrode patterns 530 which are symmetrical to each other to the left and right sides of the display area and are divided in the vertical direction, a plurality of second touch driving circuits 554 connected to respective mutual electrode patterns 530, a multiplexer 560 connected to the transparent electrode pattern 520, a display driving circuit 540 connected to the multiplexer 560 and controlling the image output, and a first touch driving circuit 552 connected to the multiplexer 560 and performing the touch sensing.

The PMOLED display of the embodiment is time-shared into the display control period and the touch sensor control period for each display frame to implement the image output and the touch sensing and may control the transparent electrode pattern 520, the lower electrode pattern 510, and the mutual electrode pattern 530 in the display control period and the touch sensor control period.

Specifically, the first touch driving circuit 552 may sequentially provide the touch driving signals SEG(TX) to the transparent electrode patterns 520, respectively in the touch sensor control period and the mutual electrode pattern 530 may receive touch driven signals RX1, RX2, RX3, . . . and RXn and transfer the touch driven signals to the second touch driving circuits 554.

The mutual electrode pattern serves as a transmitter electrode transmitting the touch driving signal and the transparent electrode pattern (including the lower electrode pattern) serves as a receiver electrode receiving the touch driven signal corresponding to the touch driving signal in the previous embodiment. The transparent electrode pattern 520 serves as the transmitter electrode and the mutual electrode patterns 530 divided in the vertical direction serve as the receiver electrodes in the embodiment. Here, in the touch sensor control period, the transparent electrode pattern 520 connected to the touch driving circuit may simultaneously transmit the touch driving signals as one electrode and the mutual electrode pattern 530 may receive the touch driven signal corresponding to the touch driving signal according to a finger location F. As an example, as shown by dotted lines in FIG. 9, the touch location F of a finger may be sensed by using that the touch driven signal is received in one RX2 of the mutual electrode patterns.

In the embodiment, the transparent electrode pattern 520 is shorted through a controller device IC to serve as one electrode, it may not the entirety but only a part may be used as the receiver electrode.

Figure 11:
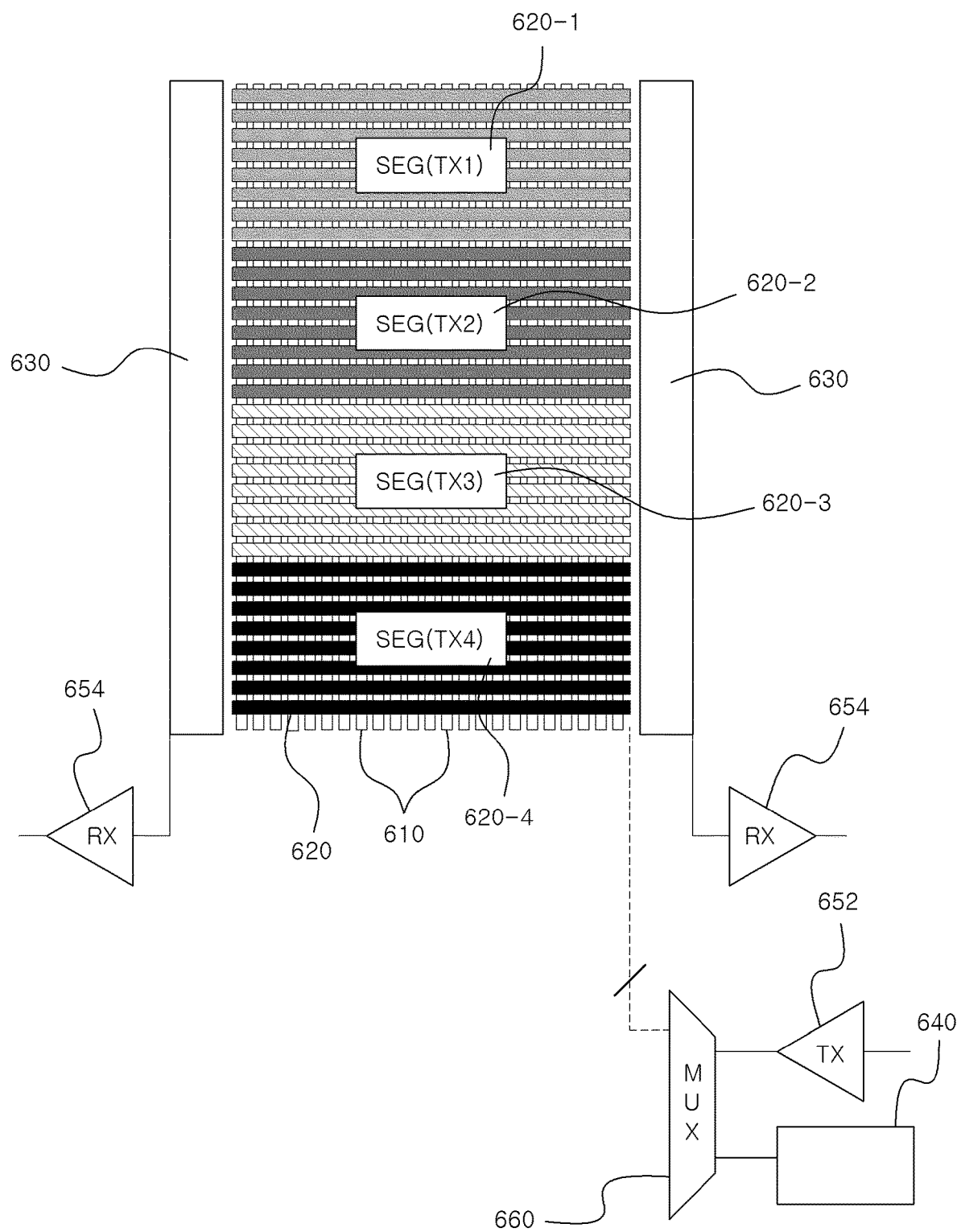
FIG. 11 is a structural diagram for describing a circuit structure of a PMOLED display according to an embodiment of the present invention.
Figure 12:
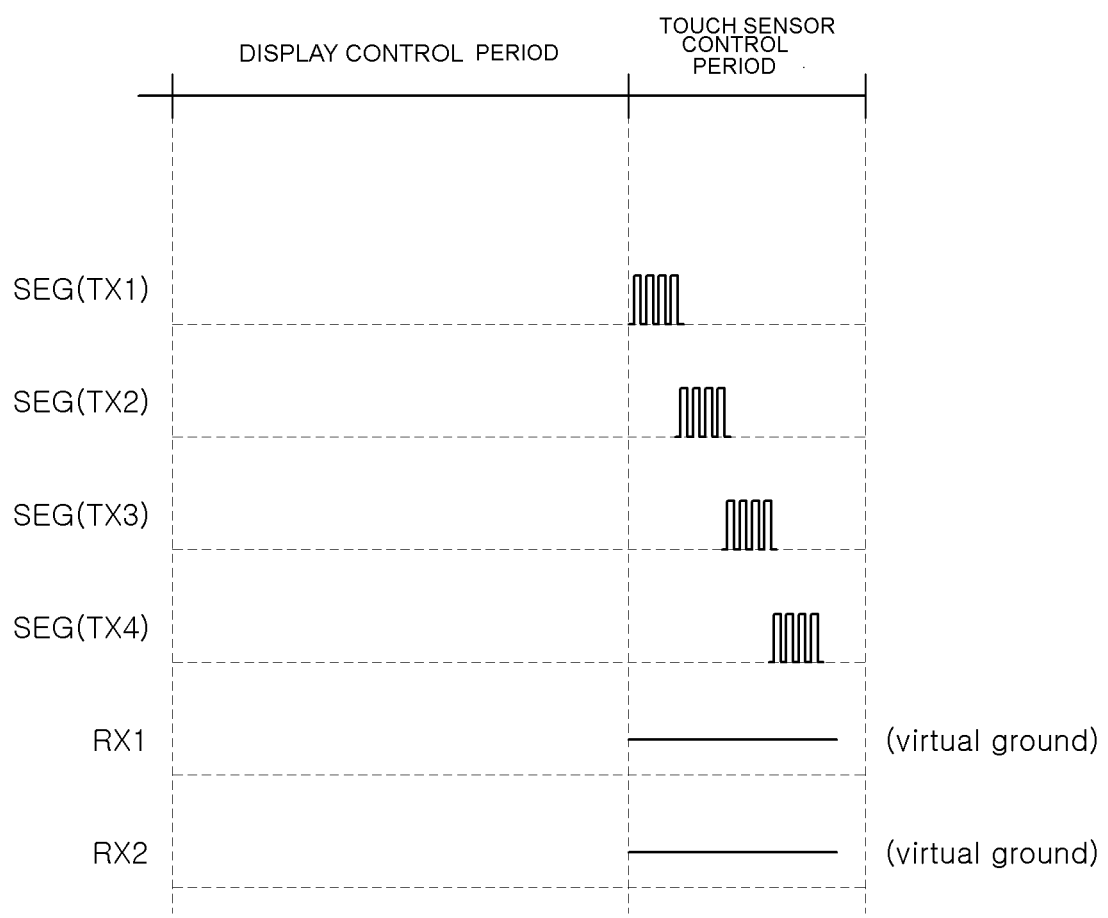
FIG. 12 is a diagram for describing a process of providing a touch driving signal to a mutual electrode pattern in a time-sharing state for each display frame in the PMOLED display of FIG. 11.

FIG. 11 is a structural diagram for describing a circuit structure of a PMOLED display according to an embodiment of the present invention and FIG. 12 is a diagram for describing a process of providing a touch driving signal to a mutual electrode pattern in a time-sharing state for each display frame in the PMOLED display of FIG. 11.

Referring to FIGS. 11 and 12, the PMOLED display includes a lower electrode pattern 610, a transparent electrode pattern 620, an organic compound layer (not illustrated) interposed between the lower electrode pattern 610 and the transparent electrode pattern 620, a plurality of mutual electrode patterns 630 which are symmetrical to each other to the left and right sides of the display area, a second touch driving circuit 654 connected to each mutual electrode pattern 630, a multiplexer 660 connected to the transparent electrode pattern 620, a display driving circuit 640 connected to the multiplexer 660 and controlling the image output, and a first touch driving circuit 652 connected to the multiplexer 660 and performing the touch sensing.

The PMOLED display of the embodiment is time-shared into the display control period and the touch sensor control period for each display frame to implement the image output and the touch sensing and may control the transparent electrode pattern 620, the lower electrode pattern 610, and the mutual electrode pattern 630 in the display control period and the touch sensor control period.

For reference, in the touch sensor control period, the multiplexer 660 may group the transparent electrode patterns into four groups 620-1 to 620-4 and each of transparent electrode patterns which are grouped in terms of a circuit may serve as one electrode.

Specifically, the first touch driving circuit 652 may sequentially provide touch driving signals SEG(TX1) to SEG(TX4) to four groups of transparent electrode patterns 620-1 to 620-4 connected, respectively in the touch sensor control period and four groups of transparent electrode patterns 620-1 to 620-4 may sequentially transmit the touch driving signals SEG(TX1) to SEG(TX4) through the multiplexer 660.

For reference, in the embodiment, the touch driving signal is provided in a time division scheme, but in some cases, may be provided in a scheme such as code division or frequency division. Further, four groups of transparent electrode patterns 620-1 to 620-4 are used as the transmitter electrodes, but in another embodiment, the lower electrode patterns are grouped to be used as the transmitter electrodes.

The mutual electrode patterns 630 received the transmitted touch driving signals SEG(TX1) to SEG(TX4) by four groups of transparent electrode patterns 620-1 to 620-4, and the received touch driven signals may be transferred to the second touch driving circuits 654.

The touch driven signals received at the mutual electrode pattern 630 may include information on a location of the display area in the vertical direction and the mutual electrode patterns 630 are provided to be horizontally symmetrical to each other, and as a result, the touch locations for the left and right sides may also be sensed from the received touch driven signal.

As described above, the present invention has been described with reference to the preferred embodiments. However, it will be appreciated by those skilled in the art that various modifications and changes of the present invention can be made without departing from the spirit and the scope of the present invention which are defined in the appended claims and their equivalents.

What is claimed is:

1. A passive matrix organic light emitting diode display which includes a plurality of lower electrode patterns arranged in parallel, a plurality of transparent electrode patterns arranged in parallel in a direction and being perpendicular to the lower electrode pattern, and an organic compound layer interposed between the lower electrode patterns and the lower electrode patterns and the transparent electrode patterns are shared in a control period for each display frame such that display control and image output is done in a display control period and a touch sensor control is done in a touch sensor control period, comprising:

a multiplexer connected to at least one of the lower electrode pattern and the transparent electrode pattern;

a display driving circuit connected to the multiplexer and providing a display driving signal for controlling the image output in the display control period;

a first touch driving circuit connected to the multiplexer and providing a touch driving signal in the touch sensor control period;

a plurality of mutual electrode patterns provided adjacent to a perimeter of a display area defined by the lower electrode patterns and the transparent electrode patterns and receiving the touch driving signal and providing a touch driven signal in response to a touch on the display area in the touch sensor control period; and a second touch driving circuit connected to the mutual electrode patterns and receiving the touch driven signal in the touch sensor control period; and wherein a location of the touch on the display area is sensed through a change in mutual capacitance by using at least one of the mutual electrode patterns as a receiver electrode and using at least one of the lower electrode patterns and the transparent electrode pattern as a transmitter electrode in the touch sensor control period; and wherein the multiplexer is configured to: connect at least one of the lower electrode patterns and the transparent electrode patterns to the display driving circuit in the display control period and connect at least one of the lower electrode patterns and the transparent electrode patterns to the first touch driving circuit in the touch sensor control period.

2. The passive matrix organic light emitting diode display of claim 1, wherein the mutual electrode patterns include at least a first mutual electrode pattern and a second mutual electrode patterns provided to be symmetrical to each other at the left and right sides or upper and lower sides of the display area.

3. The passive matrix organic light emitting diode display of claim 1, wherein the mutual electrode pattern is divided into a plurality of mutual electrode patterns and provided along one side of the display area, the multiplexer transfers the touch driving signal provided from the first touch driving circuit to the lower electrode pattern or the transparent electrode pattern in the touch sensor control period, and the second touch driving circuit receives the touch driven signal generated in the mutual electrode pattern by the touch driving signal in the touch sensor control period.

4. The passive matrix organic light emitting diode display of claim 1, wherein the lower electrode pattern or the transparent electrode pattern is grouped into one.

5. The passive matrix organic light emitting diode display of claim 1, wherein the lower electrode pattern or the transparent electrode pattern transmitting the touch driving signal is grouped into a plurality of electrode patterns and the grouped lower electrode pattern or transparent electrode pattern serves as one electrode, the touch driving signal is sequentially provided to the lower electrode pattern or the transparent electrode pattern of each group in the touch sensor control period, and the touch driven signal received at the mutual electrode pattern includes information on a location depending on an arrangement direction of the lower electrode pattern or the transparent electrode pattern.

* * * * *